United States Patent
Kuwahara et al.

(10) Patent No.: US 6,573,608 B2
(45) Date of Patent: Jun. 3, 2003

(54) SEMICONDUCTOR DEVICE WITH LAYERED SEMICONDUCTOR CHIPS

(75) Inventors: Wataru Kuwahara, Hyogo (JP); Katsunori Horie, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/983,390

(22) Filed: Oct. 24, 2001

(65) Prior Publication Data

US 2002/0163077 A1 Nov. 7, 2002

(30) Foreign Application Priority Data

May 2, 2001 (JP) .......................... 2001-135450

(51) Int. Cl.⁷ .................. H01L 23/48; H01L 23/52; H01L 29/40; H01L 21/44; H01L 21/48; H01L 21/50; H05K 1/14
(52) U.S. Cl. .................. 257/777; 438/109; 361/736
(58) Field of Search .................. 257/777; 438/109; 361/736

(56) References Cited

U.S. PATENT DOCUMENTS

| | | | | |
|---|---|---|---|---|
| 5,270,261 A | * | 12/1993 | Bertin et al. | |
| 5,977,640 A | * | 11/1999 | Bertin et al. | 257/777 |
| 6,084,294 A | * | 7/2000 | Tomita | 257/686 |
| 6,388,313 B1 | * | 5/2002 | Lee et al. | 257/686 |

FOREIGN PATENT DOCUMENTS

JP 06-021329 1/1994

* cited by examiner

*Primary Examiner*—Carl Whitehead, Jr.
*Assistant Examiner*—Nema Berezhy
(74) *Attorney, Agent, or Firm*—McDermott, Will & Emery

(57) ABSTRACT

A first semiconductor chip having a pad electrode on its main surface is disposed on a substrate, and a first wiring film electrically connecting the pad electrode to the substrate is further disposed on the substrate so as to cover the first semiconductor chip. A second semiconductor chip is disposed on the first wiring film. The second semiconductor chip has a pad electrode on its main surface opposite to another surface on which the first wiring film is disposed. A second wiring film electrically connecting the pad electrode to the substrate is disposed on the substrate so as to cover the first semiconductor chip and the second semiconductor chip.

19 Claims, 3 Drawing Sheets

SEMICONDUCTOR DEVICE WITH LAYERED SEMICONDUCTOR CHIPS

BACKGROUND OF THE INVENTION

1. Field of the Invention

The present invention relates to semiconductor devices, and more particularly to an integration technique for semiconductor chips.

2. Description of the Background Art

As information devices and the like have acquired higher functionality in recent years, the demand for integration of semiconductor devices is increasing. One of the integration techniques of semiconductor devices is lamination of a plurality of semiconductor chips.

FIG. 6 is a cross-sectional view for describing a conventional first semiconductor device. Specifically, FIG. 6 shows a conventional multilayer chip module.

In FIG. 6, reference numeral 2 denotes a first semiconductor chip; 3 a second semiconductor chip; 4 a pad electrode; 7 sealant; 10 an island; 11 a wiring member; and 12 a lead.

In the conventional first semiconductor device shown in FIG. 6, two semiconductor chips 2 and 3 of different sizes are laminated on the island 10. The pad electrodes 4 of the semiconductor chips 2 and 3 are wired to the leads 12 using wiring members 11 such as gold wires. Furthermore, the conventional first semiconductor device is molded with the sealant 7 made of resin or the like except for certain portions of the leads 12.

However, the semiconductor device shown in FIG. 6 suffers from a structural restriction due to its wiring configuration. Specifically, the pad electrodes 4 on the first semiconductor chip 2 must be exposed outside, that is, they should not be covered by the back surface of the second semiconductor chip 3.

This means that it is difficult to laminate semiconductor chips of a same size. In addition, the position on the semiconductor chip at which each pad electrode 4 is formed is restricted to, for example, the outer regions of the semiconductor chip.

To solve the above problems, the semiconductor device shown in FIG. 7 was proposed. FIG. 7 is a sectional view of a conventional second semiconductor device. Specifically, FIG. 7 shows the layered structure of semiconductor chips disclosed in Japanese Patent Laid-Open No. Hei 6-21329.

In the conventional second semiconductor device shown in FIG. 7, two wiring films 13 each have bump electrodes 6 on its front and back surfaces on which semiconductor chips 2 and 3 are disposed, respectively, through the bump electrodes 6. The wiring films 13 are connected to leads 12. Furthermore, the conventional second semiconductor device is molded with the sealant 7 made of resin or the like except for certain portions of the leads 12. This arrangement realizes lamination of semiconductor chips with ease.

However, the structure shown in FIG. 7 inevitably leads to a semiconductor device of large dimensions since it is necessary to connect the wiring films 13 with the leads 12.

Furthermore, when the module molded in the sealant 7 is mounted on a substrate (not shown), it is necessary to wire the leads 12 to the substrate. This further increases the dimensions of the semiconductor device.

Thus, with the conventional semiconductor devices described above, it is not possible to miniaturize the packages and enhance semiconductor chip density.

Before the module is molded, the bump electrodes 6 and the pad electrodes 4 are positioned (but not fixed) so that the bump electrodes 6 are in contact with the pad electrodes 4. This means that it is necessary to mold the module to fix the contacting position.

Furthermore, when the module is molded, the wiring film 13 might be unintentionally shifted, resulting in misalignment of the pad electrodes 4 with the bump electrodes 6. This reduces the reliability of the semiconductor device.

SUMMARY OF THE INVENTION

The present invention has been conceived to solve the previously-mentioned problems and a general object of the present invention is to provide a novel and useful semiconductor device.

A more specific object of the present invention is to mount semiconductor chips on a substrate with high chip-density and to laminate a plurality of semiconductor chips without molding the module.

The above object of the present invention is attained by a following semiconductor device.

According to a first aspect of the present invention, the semiconductor device comprises: a substrate; a first semiconductor chip disposed on the substrate, the first semiconductor chip having a first electrode on a main surface thereof; a first wiring disposed on the substrate so as to cover the first semiconductor chip, the first wiring electrically connecting the first electrode to the substrate; a second semiconductor chip disposed on the first wiring, the second semiconductor chip having a second electrode on a main surface thereof, the main surface being opposite to another surface which contacts with the first wiring; and a second wiring disposed on the substrate so as to cover the second semiconductor chip and the first semiconductor chip, the second wiring electrically connecting the second electrode to the substrate.

According to a second aspect of the present invention, the semiconductor device comprises: a substrate; a first semiconductor chip disposed on the substrate, the first semiconductor chip having a first electrode on a main surface thereof; a wiring disposed on the substrate so as to cover the first semiconductor chip, the wiring electrically connecting the first electrode to the substrate; and a second semiconductor chip disposed on the wiring, the second semiconductor chip having a second electrode on a main surface thereof; the main surface of the second semiconductor chip facing the main surface of the first semiconductor chip.

According to a third aspect of the present invention, the semiconductor device comprises: a first semiconductor chip having a first electrode on a main surface thereof; a wiring disposed on the first semiconductor chip so as to be in close contact with the main surface of the first semiconductor chip, the wiring electrically connecting the first electrode to the substrate; a second semiconductor chip disposed on the wiring, the second semiconductor chip having a second electrode on a main surface thereof, the main surface of the second semiconductor chip facing the main surface of the first semiconductor chip and being in close contact with the wiring; and a sealant sealing the first semiconductor chip and the second semiconductor chip.

Other objects and further features of the present invention will be apparent from the following detailed description when read in conjunction with the accompanying drawings.

DETAILED DESCRIPTION OF THE PREFERRED EMBODIMENTS

Figure 1:
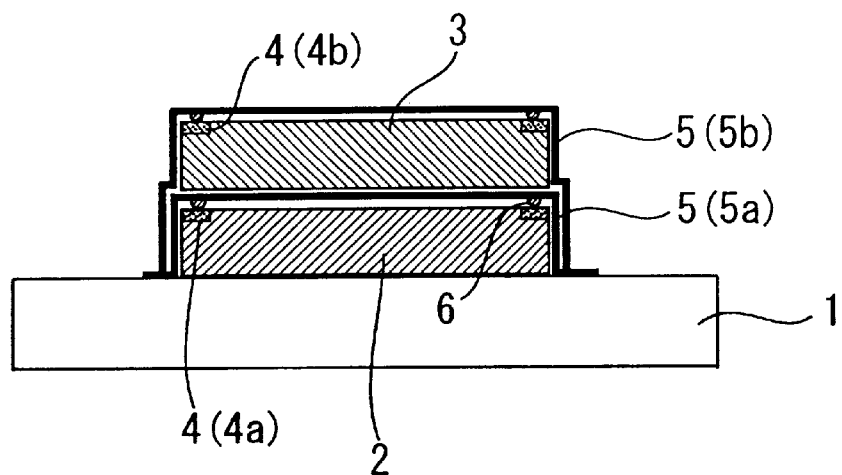
FIG. 1 is a cross-sectional view for describing a semiconductor device according to a first embodiment of the present invention.

In the following, principles and embodiments of the present invention will be described with reference to the accompanying drawings. The members and steps that are common to some of the drawings are given the same reference numerals and redundant descriptions therefore may be omitted.

First Embodiment

Figure 2:
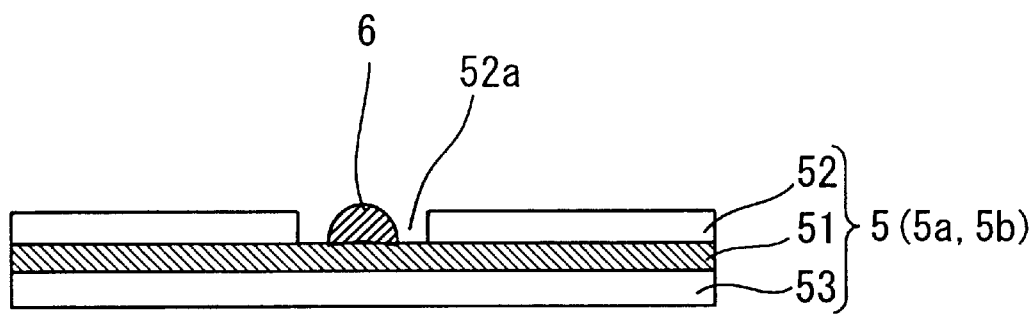
FIG. 2 is a cross-sectional view for describing a wiring film employed in the semiconductor device according to the first embodiment of the present invention.

FIG. 1 is a sectional view of a semiconductor device according to a first embodiment of the present invention. FIG. 2 is a sectional view of a wiring film employed by the semiconductor device according to the first embodiment of the present invention.

In FIGS. 1 and 2, reference numeral 1 denotes a substrate; 2 a first semiconductor chip; 3 a second semiconductor chip; 4 (4a, 4b) pad electrodes; 5 (5a, 5b) wiring films; 6 a bump electrode (contact bump); 51 a metal layer; 52 a first adhesive layer; 52a an opening portion; and 53 a second adhesive layer.

The substrate 1 is a mounting substrate or a circuit substrate, and the first semiconductor chip 2 and the second semiconductor chip 3 are mounted on the main surface of the substrate 1. The first semiconductor chip 2 and the second semiconductor chip 3 are, for example, semiconductor memories such as DRAMs.

The pad electrodes 4 (4a, 4b) are electrodes shaped like pads formed on the main surfaces of the first semiconductor chip 2 and the second semiconductor chip 3, respectively. The pad electrodes 4 are made of, for example, Au, Cu or Al, or their alloys.

The wiring films 5 (5a, 5b) electrically connect the substrate 1 with the semiconductor chips 2 and 3 as well as mounting the semiconductor chips 2 and 3 onto the substrate 1. More specifically, the pad electrodes 4 formed on the semiconductor chips 2 and 3 is electrically connected with the substrate 1 through the wiring films 5.

As shown in FIG. 2, each of the wiring films 5 (5a, 5b) includes the metal layer 51, the first adhesive layer 52 covering one surface of the metal layer 51, and the second adhesive layer 53 covering the other surface of the metal layer 51.

That is, the first wiring film 5a is produced by laminating the first adhesive layer 52 covering the first semiconductor chip 2, the metal layer 51 covering the first adhesive layer 52, and the second adhesive layer 53 whose one surface covers the metal layer 51 and whose other surface is in contact with the second semiconductor chip 3.

The second wiring film 5b, on the other hand, is produced by laminating the first adhesive layer 52 covering the second semiconductor chip 3 and the first semiconductor chip 2, the metal layer 51 covering the first adhesive layer 52, and the second adhesive layer 53 covering the metal layer 51.

End portions of the metal layer 51 are electrically connected to electrodes (not shown) formed on the substrate 1.

It should be noted that the first adhesive layer 52 and the second adhesive layer 53 are, for example, insulating films having adhesives coated on their surfaces. An example of the insulating films is a polyimide film, while an example of the adhesives is an epoxy adhesive. Furthermore, end portions of the first adhesive layer 52 and the second adhesive layer 53 are in contact with the substrate 1.

The first adhesive layer 52 has an opening portion 52a at a position corresponding to each pad electrode 4, and a bump electrode 6 is formed on the metal film 51 exposed through each opening 52a. As shown in FIG. 1, the bump electrodes 6 are placed in contact with the pad electrodes 4a and 4b formed on the main surfaces of the first semiconductor chip 2 and the second semiconductor chip 3.

As shown in FIG. 1, in the semiconductor device according to the first embodiment, the first semiconductor chip 2 is disposed on the main surface of the substrate 1, and the first wiring film 5a disposed on the substrate 1 covers the first semiconductor chip 2. The pad electrodes 4a on the first semiconductor chip 2 are in contact with the bump electrodes 6 formed on one surface of the first wiring film 5a. Furthermore, both ends of the first wiring film 5a are electrically connected to the substrate 1. Although not shown in FIG. 1, the main surface and the sides of the first semiconductor chip 2 are in contact with the first adhesive layer 52 of the first wiring film 5a.

On the other hand, the second semiconductor chip 3 is disposed on the other surface of the first wiring film 5a, that is, the surface opposite to that on which the bump electrodes 6 are formed. Although not shown in FIG. 1, the second adhesive layer 53 of the first wiring film 5a is in contact with the back surface of the second semiconductor chip 3.

That is, one surface of the first wiring film 5a is adhered and fixed onto the first semiconductor chip 2, while the other surface of the first wiring film 5a is adhered and fixed onto the second semiconductor chip 3.

Furthermore, the second wiring film 5b is disposed so that it covers the second semiconductor chip 3 and the first semiconductor chip 2 fixed with the first wiring film 5a. Although not shown in FIG. 1, the first adhesive layer 52 of the second wiring film 5b is in contact with the main surface and the sides of the second semiconductor chip 3.

That is, one surface of the second wiring film 5b is adhered and fixed onto the second semiconductor chip 3.

Furthermore, the semiconductor chips 2 and 3 are mounted onto the substrate 1 by use of the wiring films 5a and 5b.

As described above, in the semiconductor device according to the first embodiment, the adhesive first wiring film 5a is disposed so that it covers the first semiconductor chip 2 disposed on the substrate 1, and the adhesive second wiring film 5b is disposed so that it covers the second semiconductor chip 3 disposed on the first wiring film 5a.

The semiconductor device according to the first embodiment does not require conventional external leads in order to mount the semiconductor chips 2 and 3 on the substrate 1, making it possible to reduce the mounting area for laminating the semiconductor chips. Therefore, it is possible to mount semiconductor chips on a substrate with high chip-density.

Further, since the semiconductor chips 2 and 3 are directly mounted on the substrate 1 by use of the wiring films 5a and 5b, it is not necessary to wire leads to the substrate as the conventional semiconductor device. Therefore, it is possible to reduce the number of manufacturing processes to be employed and thereby reduce the cost for manufacturing semiconductor devices.

Further, the first wiring film 5a and the second wiring film 5b are each produced by laminating the metal layer 51 and the adhesive layers 52 and 53, which cover both sides of the metal layer 51. The first adhesive layers 52 of the wiring films 5a and 5b are in contact with the main surfaces of the semiconductor chips 2 and 3, respectively. Furthermore, the two semiconductor chips 2 and 3 are fixed by use of the first wiring film 5a.

This arrangement makes it possible to prevent misalignment of the bump electrodes 6 of the wiring films 5a and 5b with the pad electrodes 4a and 4b on the semiconductor chips 2 and 3, which eliminates the need for employing the conventional resin sealing. That is, the contact between the pad electrodes 4 and the bump electrodes 6 is fully established without molding the module with sealant, making it possible to laminate the semiconductor chips 2 and 3. This reduces the number of manufacturing processes to be employed and thereby reduces the cost for manufacturing semiconductor devices. Furthermore, since it is possible to decrease the dimensions of the semiconductor device by those of the sealant 7, semiconductor chips can be disposed with higher chip-density.

Further, the wiring film 5a is formed so as to cover the semiconductor chip 2, and the wiring film 5b is formed so as to cover the semiconductor chips 2 and 3. With this arrangement, the surfaces of the semiconductor chips 2 and 3 and the surfaces of the pad electrodes 4 are shielded from the outside by the wiring films 5a and 5b, the wiring films 5a and 5b protecting these surfaces. Specifically, it is possible to prevent foreign objects, e.g. dust or particles, from attaching to the surfaces of the semiconductor chips 2 and 3 as well as preventing metal oxidation of the surfaces of the pad electrodes 4, which enhances the reliability of the semiconductor device.

It should be noted that the semiconductor chips 2 and 3 may be molded by forming sealant on the substrate 1 so that the sealant covers the semiconductor chips 2 and 3. Also in this case, the external leads are not required. Therefore, it is possible to reduce the dimensions of the semiconductor device as compared with the conventional semiconductor devices and to mount semiconductor chips with high chip-density. Furthermore, the positions of the pad electrodes 4a and 4b and the positions of the bump electrodes 6 formed on the wiring films 5a and 5b are fixed on the semiconductor chips 2 and 3. Therefore, it is possible to prevent misalignment of these positions at the time of the molding.

According to the first embodiment, the two semiconductor chips 2 and 3 are laminated. However, three or more semiconductor chips may be laminated. Also in this case, the same effect as that obtained as a result of laminating two semiconductor chips can be obtained.

Furthermore, even though the first embodiment employs the semiconductor chips 2 and 3 of the same size, semiconductor chips of different sizes may be used.

Second Embodiment

Figure 3:
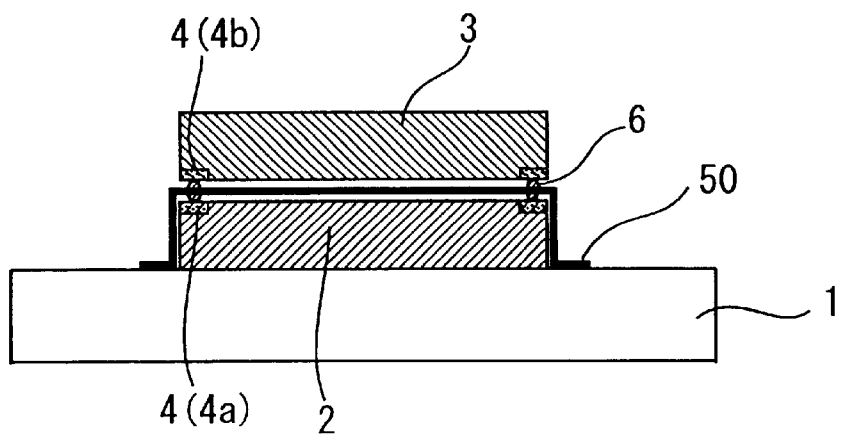
FIG. 3 is a cross-sectional view for describing a semiconductor device according to a second embodiment of the present invention.
Figure 4:
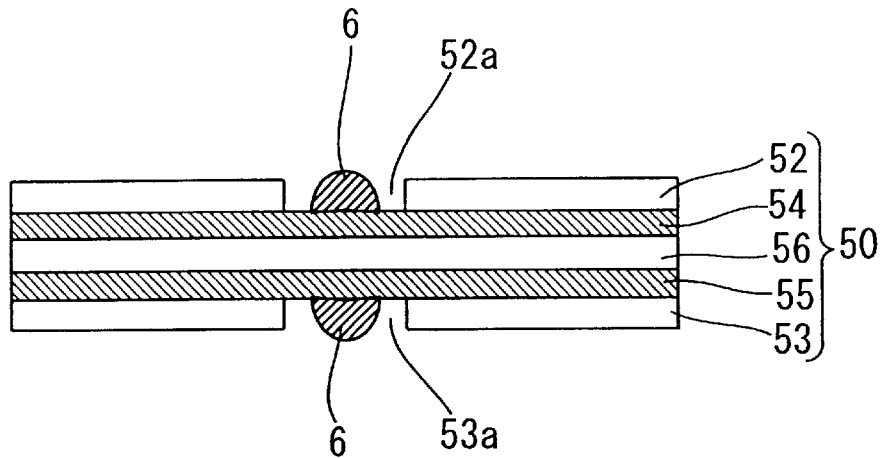
FIG. 4 is a cross-sectional view for describing a wiring film employed in the semiconductor device according to the second embodiment of the present invention.

FIG. 3 is a sectional view of a semiconductor device according to a second embodiment of the present invention. FIG. 4 is a sectional view of a wiring film employed in the semiconductor device according to the second embodiment of the present invention. Components of the semiconductor device in FIG. 3 which are the same as or correspond to those of the semiconductor device in FIG. 1 are denoted by like numerals to omit detailed descriptions. Such omission is also applied to the wiring film.

In FIGS. 3 and 4, reference numeral 50 denotes a wiring film; 52 a first adhesive layer; 52a an opening portion; 53 a second adhesive layer; 53a an opening portion; 54 a first metal layer; 55 a second metal layer; and 56 an insulating layer.

As shown in FIG. 4, the wiring film 50 includes the first adhesive layer 52 whose one surface covers the first semiconductor chip 2 (see FIG. 3), the first metal layer 54 covering the first adhesive layer 52, the insulating layer 56 covering the first metal layer 54, the second metal layer 55 covering the insulating layer 56, and the second adhesive layer 53 whose one surface covers the second metal layer 55 and whose other surface is in contact with the main surface of the second semiconductor chip 3 (see FIG. 3).

As shown in FIG. 4, the first adhesive layer 52 and the second adhesive layer 53 have openings 52a and 53a, respectively, at positions corresponding to pad electrodes 4. The bump electrodes 6 are formed on the first metal film 54 and the second metal film 55 exposed through the openings 52a and 53a. As shown in FIG. 3, the bump electrodes 6 are placed in contact with the pad electrodes 4 formed on the main surfaces of the first semiconductor chip 2 and the second semiconductor chip 3. The wiring film 50 (specifically the first metal film 54 and the second metal film 55) is electrically connected to electrodes (not shown) formed on the substrate 1. The insulating layer 56 is made of, for example, an insulating film such as a polyimide film.

As shown in FIG. 3, in the semiconductor device according to the second embodiment, the first semiconductor chip 2 is disposed on the substrate 1, and the wiring film 50 disposed on the substrate 1 covers the first semiconductor chip 2. The pad electrodes 4 on the first semiconductor chip 2 are in contact with the bump electrodes 6 formed on the first metal layer 54 of the wiring film 50. Furthermore, both ends of the wiring film 50 are connected to electrodes on the substrate 1. Although not shown in FIG. 3, the main surface and the sides of the first semiconductor chip 2 are in contact with the first adhesive layer 52 of the wiring film 50.

The second semiconductor chip 3 is disposed on the wiring film 50 so that its main surface faces the main surface of the first semiconductor chip 2. The second adhesive layer 53 of the wiring film 50 is in contact with the main surface of the second semiconductor chip 3.

That is, the first semiconductor chip 2 and the second semiconductor chip 3 are each adhered and fixed onto a respective side of the wiring film 50. The semiconductor chips 2 and 3 are mounted on the substrate 1 by use of the wiring film 50.

As described above, in the semiconductor device according to the second embodiment, the wiring film 50 is disposed so that it covers the first semiconductor chip 2 disposed on the substrate 1. The second semiconductor chip 3 is disposed on the wiring film 50 so that its main surface faces the main surface of the first semiconductor chip 2.

That is, in the second embodiment, the first semiconductor chip 2 and the second semiconductor chip 3 are disposed so that their main surfaces face each other through the wiring film 50.

As with the first embodiment, the semiconductor device according to the second embodiment does not require conventional external leads in order to mount the semiconductor chips 2 and 3 on the substrate 1, making it possible to reduce the mounting area. Therefore, it is possible to mount semiconductor chips on the substrate with high chip-density.

The other effects of the first embodiment can also be obtained by the second embodiment.

Furthermore, since the second embodiment mounts the two semiconductor chips 2 and 3 on the substrate 1 using only one wiring film 50, it is possible to reduce the thickness of the semiconductor device as compared with that of the first embodiment.

In addition, since the semiconductor chips 2 and 3 employ only one wiring film 50 as their wiring, the lengths of their wiring can be made equal to each other. Therefore, it is possible to reduce variations in operational characteristics of the semiconductor device at high-speed operation, thereby improving its characteristics.

Third Embodiment

Figure 5:
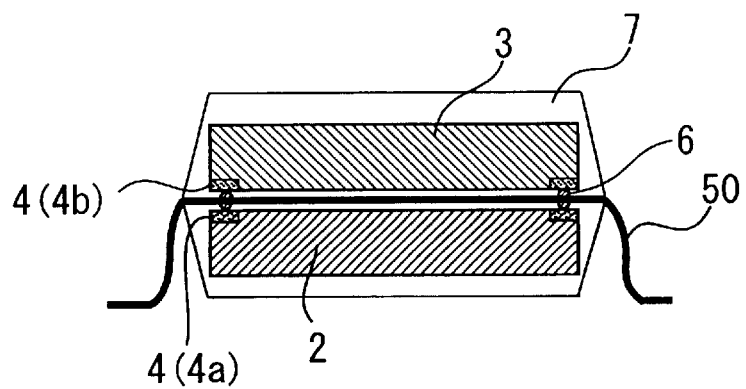
FIG. 5 is a cross-sectional view for describing a semiconductor device according to a third embodiment of the present invention.
Figure 6:
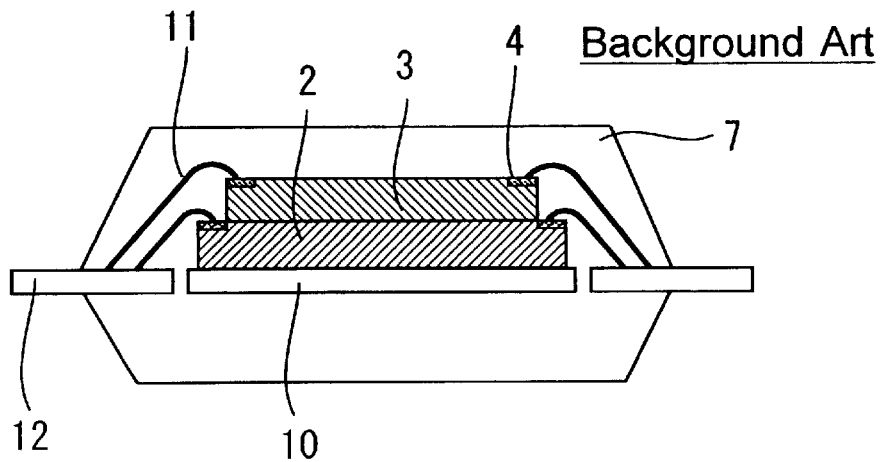
FIG. 6 is a cross-sectional view for describing a conventional first semiconductor device.
Figure 7:
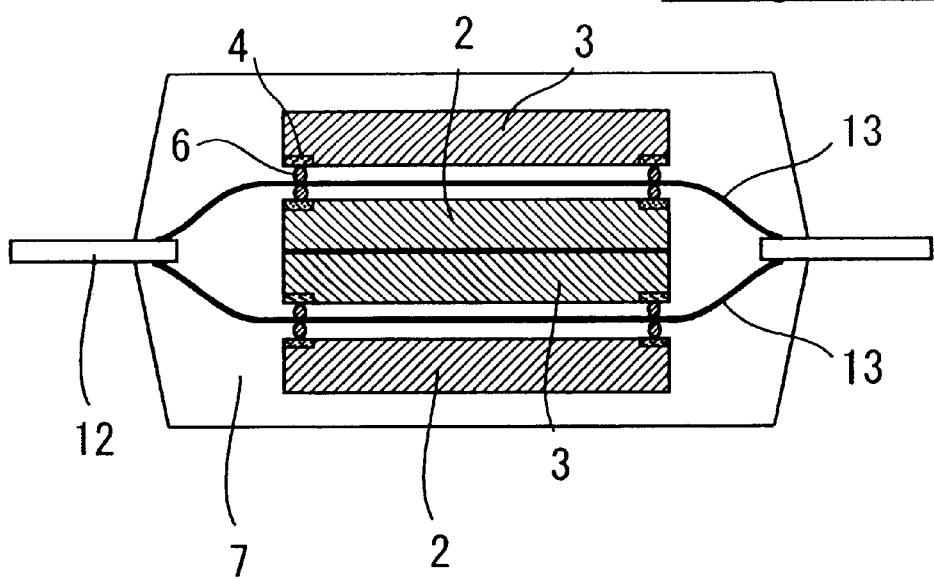
FIG. 7 is a cross-sectional view for describing a conventional second semiconductor device.

FIG. 5 is a sectional view of a semiconductor device according to a third embodiment of the present invention.

A semiconductor device of the third embodiment is a semiconductor chip package to be mounted on a substrate. The semiconductor device according to the third embodiment is different from that of the second embodiment in that the semiconductor chips 2 and 3 of the third embodiment are not mounted on a substrate but molded with sealant 7 instead.

The sealant 7 is made of, for example, resin. Since the other components of the third embodiment are the same as those of the second embodiment, their explanation will be omitted.

As shown in FIG. 5, in the semiconductor device according to the third embodiment, the wiring film 50 is disposed on the first semiconductor chip 2 so that they are in close contact with each other. The second semiconductor chip 3 is disposed on the wiring film 50 so that the second semiconductor chip 3 is in close contact with the wiring film 50, and so that the main surface of the second semiconductor chip 3 faces the main surface of the first semiconductor chip 2. The semiconductor device, having the wiring film 50 and the semiconductor chips 2 and 3, is molded with the sealant 7 except for a predetermined length of each end portion of the wiring film 50.

The end portions of the wiring film 50 which are not molded are used to mount the semiconductor device (package) on the substrate.

Although not shown in FIG. 5, the main surface of the first semiconductor chip 2 is in contact with the first adhesive layer 52 of the wiring film 50 (refer to FIG. 4). Furthermore, the main surface of the second semiconductor chip 3 is in contact with the second adhesive layer 53 of the wiring film 50. With this arrangement, the first semiconductor chip 2 and the second semiconductor chip 3 are fixed through the wiring film 50.

The semiconductor device according to the third embodiment does not require conventional external leads in order to laminate the semiconductor chips 2 and 3, making it possible to reduce the mounting area of the package on the substrate, as compared with the conventional semiconductor device. Therefore, it is possible to mount semiconductor chips on the substrate with high chip-density.

By employing the wiring film 50 having adhesive layers 52 and 53, the two semiconductor chips 2 and 3 can be easily laminated one on the other.

Furthermore, since the semiconductor chips 2 and 3 are fixed through the wiring film 50, it is possible to prevent misalignment between the pad electrodes 4 and the bump electrodes 6, which facilitates the molding by use of the sealant 7.

This invention, when practiced illustratively in the manner described above, provides the following major effects:

The present invention is capable of mounting semiconductor chips with high chip-density. Furthermore, the present invention can laminate a plurality of semiconductor chips without molding the module.

Further, the present invention is not limited to these embodiments, but variations and modifications may be made without departing from the scope of the present invention.

The entire disclosure of Japanese Patent Application No. 2001-135450 filed on May 2, 2001 containing specification, claims, drawings and summary are incorporated herein by reference in its entirety.

What is claimed is:

1. A semiconductor device comprising:

a substrate;

a first semiconductor chip disposed on said substrate, said first semiconductor chip having a first electrode on a main surface thereof;

a first wiring disposed on said substrate so as to cover the main surface and sides of said first semiconductor chip, said first wiring electrically connecting said first electrode to said substrate;

a second semiconductor chip disposed on said first wiring, said second semiconductor chip having a second electrode on a main surface thereof, the main surface being opposite to another surface which contacts with said first wiring; and a second wiring disposed on said substrate so as to cover said second semiconductor chip and said first semiconductor chip, said second wiring electrically connecting said second electrode to said substrate.

2. The semiconductor device according to claim 1, wherein said first wiring is a first wiring film which includes:

a first adhesive layer covering said first semiconductor chip;

a metal layer covering said first adhesive layer; and a second adhesive layer whose one surface covers said metal layer and whose other surface contacts with said second semiconductor chip, and wherein said second wiring is a second wiring film which includes:

a first adhesive layer covering said second semiconductor chip;

a metal layer covering said first adhesive layer; and a second adhesive layer covering said metal layer.

3. The semiconductor device according to claim 2, wherein each first adhesive layer has an opening portion corresponding to said first or second electrode, and each metal layer has a bump on a portion exposed through said opening portion, said bump being in contact with said first or second electrode.

4. The semiconductor device according to claim 3, wherein each first adhesive layer and each second adhesive layer have an electrical insulation property.

5. The semiconductor device according to claim 2, wherein each first adhesive layer and each second adhesive layer have an electrical insulation property.

6. The semiconductor device according to claims 2, further comprising a sealant formed on said substrate so as to cover said second wiring.

7. The semiconductor device according to claims 1, further comprising a sealant formed on said substrate so as to cover said second wiring.

8. A semiconductor device comprising:

a substrate;

a first semiconductor chip disposed on said substrate, said first semiconductor chip having a first electrode on a main surface thereof;

a wiring disposed on said substrate so as to cover said first semiconductor chip, said wiring electrically connecting said first electrode to said substrate; and a second semiconductor chip disposed on said wiring, said second semiconductor chip having a second electrode on a main surface thereof; the main surface of said second semiconductor chip facing the main surface of said first semiconductor chip.

9. The semiconductor device according to claim 8, wherein said wiring is a wiring film which includes:

a first adhesive layer whose one surface covers said first semiconductor chip;

a first metal layer covering said first adhesive layer;

an insulating layer covering said first metal layer;

a second metal layer covering said insulating layer; and a second adhesive layer whose one surface covers said second metal layer and whose other surface is in contact with the main surface of said second semiconductor chip.

10. The semiconductor device according to claim 9, wherein each adhesive layer has an opening portion corresponding to said first or second electrode, and each metal layer has a bump on a portion exposed through said opening portion, said bump being contact with said first or second electrode.

11. The semiconductor device according to claim 10, wherein said first adhesive layer and said second adhesive layer each have an electrical insulation property.

12. The semiconductor device according to claim 9, wherein said first adhesive layer and said second adhesive layer each have an electrical insulation property.

13. The semiconductor device according to claim 9, further comprising a sealant formed on said substrate so as to cover said first and second semiconductor chips.

14. The semiconductor device according to claim 8, further comprising a sealant formed on said substrate so as to cover said first and second semiconductor chips.

15. A semiconductor device comprising:

a substrate;

a first semiconductor chip having a first electrode on a main surface thereof;

a wiring disposed on said first semiconductor chip so as to be in close contact with the main surface of said first semiconductor chip, said wiring electrically connecting said first electrode to said substrate;

a second semiconductor chip disposed on said wiring, said second semiconductor chip having a second electrode on a main surface thereof, the main surface of said second semiconductor chip facing the main surface of said first semiconductor chip and being in close contact with said wiring; and a sealant sealing said first semiconductor chip and said second semiconductor chip.

16. The semiconductor device according to claim 15, wherein said wiring is a wiring film which includes:

a first adhesive layer whose one surface covers the main surface of said first semiconductor chip;

a first metal layer covering said first adhesive layer;

an insulating layer covering said first metal layer;

a second metal layer covering said insulating layer; and a second adhesive layer whose one surface covers said second metal layer and whose other surface is in contact with the main surface of said second semiconductor chip.

17. The semiconductor device according to claim 16, wherein each adhesive layer has an opening portion corresponding to said first or second electrode, and each metal layer has a bump on a portion exposed through said opening portion, said bump being in contact with said first or second electrode.

18. The semiconductor device according to claim 17, wherein said first adhesive layer and said second adhesive layer each have an electrical insulation property.

19. The semiconductor device according to claim 16, wherein said first adhesive layer and said second adhesive layer each have an electrical insulation property.

* * * * *